(12) United States Patent
Duport et al.

(10) Patent No.: US 12,219,878 B2
(45) Date of Patent: Feb. 4, 2025

(54) OPTOELECTRONIC COMPONENT COMPRISING, ON A SINGLE SUBSTRATE, AN OPTICAL TRANSDUCER MADE OF A SEMI-CONDUCTOR MATERIAL III-V AND AN OPTICALLY SCANNING MICROELECTROMECHANICAL SYSTEM

(71) Applicant: THALES, Courbevoie (FR)

(72) Inventors: François Duport, Palaiseau (FR); Guang-Hua Duan, Sceaux (FR); Frédéric Van Dijk, Palaiseau (FR); Sylvain Delage, Orsay (FR)

(73) Assignee: THALES, Courbevoie (FR)

( * ) Notice: Subject to any disclaimer, the term of this patent is extended or adjusted under 35 U.S.C. 154(b) by 416 days.

(21) Appl. No.: 17/787,326

(22) PCT Filed: Dec. 18, 2020

(86) PCT No.: PCT/EP2020/087289
§ 371 (c)(1),
(2) Date: Jun. 19, 2022

(87) PCT Pub. No.: WO2021/123359
PCT Pub. Date: Jun. 24, 2021

(65) Prior Publication Data
US 2023/0019436 A1    Jan. 19, 2023

(30) Foreign Application Priority Data
Dec. 19, 2019  (FR) ..................................... 1914860

(51) Int. Cl.
*H10N 30/50*      (2023.01)
*B81B 3/00*       (2006.01)
(Continued)

(52) U.S. Cl.
CPC ........... *H10N 30/50* (2023.02); *B81B 3/0027* (2013.01); *G01S 7/4813* (2013.01); *G01S 7/4817* (2013.01);
(Continued)

(58) Field of Classification Search
CPC .......................... G02B 26/0833; G01S 7/4813
See application file for complete search history.

(56) References Cited

U.S. PATENT DOCUMENTS 6,002,507 A  * 12/1999  Floyd ..................... G02B 26/10
                                                         359/224.1
2015/0103321 A1    4/2015  Reiss et al.
(Continued)

FOREIGN PATENT DOCUMENTS

DE      10 2015 225 863 A1    6/2017
WO         2017/132704 A1     8/2017

OTHER PUBLICATIONS

Hulme, et al., "Fully integrated hybrid silicon two dimensional beam scanner", Optics Express, vol. 23, Issue 5, pp. 5861-5874, 2015.

*Primary Examiner* — Britt D Hanley
*Assistant Examiner* — Victor V Barzykin
(74) *Attorney, Agent, or Firm* — BakerHostetler

(57) ABSTRACT

An optoelectronic component includes an optical transducer made of III-V semiconductor material and an optical scanning microelectromechanical system comprising a mirror. The optical transducer and the optical scanning microelectromechanical system are produced on a common wafer comprising at least a first layer made of silicon or silicon nitride with a thickness of less than one micron and wherein at least the mirror and its holding springs are produced. In a first variant, the mobile parts of the optical scanning microelectromechanical system are produced in various layers of silicon. In a second variant, the mobile parts of the (Continued)

optical scanning microelectromechanical system are produced in the layer of III-V semiconductor material.

11 Claims, 5 Drawing Sheets

(51) Int. Cl.
| | | |
|---|---|---|
| *G01S 7/481* | (2006.01) | |
| *G01S 17/42* | (2006.01) | |
| *G02B 26/08* | (2006.01) | |
| *G02B 26/10* | (2006.01) | |
| *H10N 30/85* | (2023.01) | |
| *H01L 31/0232* | (2014.01) | |
| *H01S 5/00* | (2006.01) | |

(52) U.S. Cl.
CPC .......... *G01S 17/42* (2013.01); *G02B 26/0833* (2013.01); *G02B 26/105* (2013.01); *H10N 30/852* (2023.02); *B81B 2203/051* (2013.01); *H01L 31/02325* (2013.01); *H01S 5/0071* (2013.01)

(56) References Cited

U.S. PATENT DOCUMENTS

| | | |
|---|---|---|
| 2015/0131080 A1 | 5/2015 | Retterath et al. |
| 2017/0269215 A1 | 9/2017 | Hall et al. |
| 2018/0052378 A1 | 2/2018 | Shin et al. |

\* cited by examiner

OPTOELECTRONIC COMPONENT COMPRISING, ON A SINGLE SUBSTRATE, AN OPTICAL TRANSDUCER MADE OF A SEMI-CONDUCTOR MATERIAL III-V AND AN OPTICALLY SCANNING MICROELECTROMECHANICAL SYSTEM

CROSS-REFERENCE TO RELATED APPLICATIONS

This application is a National Stage of International patent application PCT/EP2020/087289, filed on Dec. 18, 2020, which claims priority to foreign French patent application No. FR 1914860, filed on Dec. 19, 2019, the disclosures of which are incorporated by reference in their entirety.

FIELD OF THE INVENTION

The invention lies in the field of optoelectronic devices that provide functions of optical transduction and mechanical deflection of light beams. An optical transducer is understood to mean a component that transforms an electrical signal into an optical signal, or vice versa. By way of example, an emitting optical transducer may be a laser and a receiving optical transducer may be a photodiode.

BACKGROUND

The combination of an optical transducer and deflection means has a very large number of applications. By way of example, this type of device may be used in the production of LiDAR systems, LiDAR being the acronym for the expression "Light Detection And Ranging", image projection systems, or even free-space optical telecommunications systems.

There are many solutions for deflecting the optical beam. A first solution consists in achieving the deflection by way of an interferential optical system. Light is then directed in a given direction in space as a function of its wavelength. In general, this involves splitting the optical signal into several light points and imposing a phase shift between these points. The interference between the signals coming from these various points is constructive in a given direction. By varying the phase shift between these points, either using phase modulators or by varying the wavelength of the laser that is used, the system scans the direction pointed at by the optical beam.

In such a system, the optical sources able to be used are necessarily limited, and there are serious constraints on the interferential optical system in terms of obtaining the necessary speed and tuning depth. Moreover, these systems do not allow homogeneous scanning of space. Additional information about this type of system may be found in the reference publications US2018/052378 entitled "Optical phase array (OPA)" and in the publication DE102015225863 entitled "Optische phasengesteuerte Anordnung and LiDAR System" [Optical phase-controlled arrangement and LiDAR system].

A second solution consists in achieving the deflection by way of a mechanical system displacing a mirror in two directions in space. One of the advantages of this solution is that it is independent of the wavelength of the radiation emitted or received.

This mechanical system may be a microelectromechanical system, known by the acronym "MEMS". The step of assembling the mechanical system with the transducer requires great precision and may be a source of failure if the assembly moves during the service life of the device, when said device is subjected to harsh environmental constraints. This is the case notably for systems on board various types of vehicles.

A third solution consists in implementing a device comprising a plurality of sources or detectors, each source or each detector pointing in a given direction in space. The detectors or the sources may be installed in a strip or in a matrix array. The reference publication US2015131080 entitled "Methods and Apparatus for Array Based Lidar Systems with Reduced Interference" describes a system of this type.

Finally, some LiDAR systems use a combination of these various solutions to scan space using the optical beam. Reference may be made to the systems described in reference publication US2017269215 entitled "Integrated Illumination And Detection For LIDAR Based 3-D Imaging" and reference publication WO2017132704 entitled "LIDAR based 3-D imaging with far-field illumination overlap", which use strips of photodetectors installed on a mobile turret.

All existing solutions are based on two separate devices for the transduction and scanning functions. These two devices are generally assembled after they have been manufactured so as to perform the final function of scanning space with an optical beam. The precision and the robustness of this assembly is a crucial point and may be the source of high costs as well as potential failures during the service life of the system, when said system is subjected to harsh environments, on both a thermal and vibrational level, notably in applications on board a vehicle.

SUMMARY OF THE INVENTION

In order to avoid these various drawbacks and in particular the tricky final assembly step, the optoelectronic component according to the invention integrates both the transduction and deflection functions on one and the same electronic chip. To this end, III-V materials are integrated heterogeneously onto a previously designed silicon platform in order also to allow the production of mechanical microsystems on silicon. III-V semiconductors are materials composed of one or more elements from column III and column V of Mendeleev's Periodic Table. By way of example, the elements from column III are boron, gallium, aluminum or indium and those from column V are arsenic, antimony or phosphorus.

It then becomes possible to produce a MEMS device responsible for the deflection of the optical beam on the same chip. The two functions are optically aligned during the manufacture of the components in a clean room, on the scale of the entire substrate or wafer. By virtue of the unrivalled precision of the means for manufacturing silicon components, this alignment is highly precise, much more precise than when it is carried out by the mechanical assembly of two components, and no longer requires an additional production step after the components have been manufactured.

The manufacturing time and costs added by the production of MEMS on the hybrid components are largely offset by the time saving linked to the absence of any assembly after manufacture in the clean room, the additional technological steps being pooled for all of the components of one and the same wafer. Finally, since monolithic components are involved, there is no longer any possible failure of the assembly during the service life of the component. In addition, a component according to the invention occupies a very small total surface area, of the order of a few square millimeters. Thus, on a wafer with a diameter of 100 millimeters, it is possible to produce around one thousand components simultaneously.

More specifically, the subject of the invention is an optoelectronic component comprising an optical transducer made of III-V semiconductor material and an optical scanning microelectromechanical system comprising a mirror, characterized in that the optical transducer and the optical scanning microelectromechanical system are produced in a common wafer comprising at least a first layer made of silicon or silicon nitride with a thickness of less than one micron and in which at least the mirror and its holding springs are produced.

The wafer in which the transducer and the optical scanning microelectromechanical system are produced consists of a stack of layers each comprising silicon and a layer of III-V material.

The MEMS and the optical transducer are formed in layers of this wafer. In other words, the layers comprise these elements, and the respective layers are in one piece.

Advantageously, the wafer comprises, in this order, the layer of III-V semiconductor material, the first layer made of silicon or silicon nitride with a thickness of less than one micron, and a second layer made of silicon oxide. The optoelectronic component comprises an optical guide contained within the first layer and the second layer.

In a first embodiment, the common wafer comprises, in this order, a layer of III-V semiconductor material, the first layer made of silicon or silicon nitride, a second layer made of silicon oxide, a third layer made of silicon, a fourth layer made of silicon oxide, and a substrate, the optical transducer comprising an optical guide being produced in the first layer and the second layer, mobile parts of the optical scanning microelectromechanical system being produced in the third layer and the fourth layer.

Advantageously, a transfer layer made of silicon oxide is arranged between the layer of III-V semiconductor material and the first layer made of silicon or silicon nitride.

Advantageously, the thickness of the second layer is between 3 microns and 4 microns, the thickness of the third layer is between 10 microns and 100 microns and the thickness of the fourth layer is between 3 microns and 4 microns.

In a second embodiment, the common wafer comprises, in this order, a layer of III-V semiconductor material, the first layer made of silicon or silicon nitride, a second layer made of silicon oxide, and a substrate, the optical transducer comprising an optical guide being produced in the first layer and the second layer, the mobile parts of the optical scanning microelectromechanical system being produced in the layer of III-V semiconductor material.

Advantageously, a transfer layer made of silicon oxide is arranged between the layer of III-V semiconductor material and the first layer made of silicon or silicon nitride.

Advantageously, the thickness of the second layer is between 3 microns and 4 microns.

Advantageously, the holding springs are two identical flat leaves having substantially the shape of elongated rectangles located on either side of the mirror, the mirror being connected to said leaves by a single attachment, the mobile parts consist of two identical beams, parallel to one another, each beam being connected to a set of voltage-controlled interdigitated combs so as to ensure the displacement of each beam in one and the same given direction; each leaf is integral with one of the two beams and moves therewith, the displacement of the beams causing the leaves to buckle in abutment on the optical guide, joint buckling of the two leaves tilting the mirror in a first direction, differential buckling of the two leaves tilting the mirror in a second direction.

Advantageously, the optical transducer is a laser.

Advantageously, the optical transducer is a photodiode.

Advantageously, the wafer consists of layers each comprising silicon and the layer of III-V semiconductor material.

BRIEF DESCRIPTION OF THE DRAWINGS

Other features, details and advantages of the invention will become apparent from reading the description, which is given with reference to the appended drawings, which are given by way of example and in which, respectively.

DETAILED DESCRIPTION

The optoelectronic component according to the invention comprises an optical transducer made of III-V semiconductor material and an optical scanning microelectromechanical system, denoted MEMS, comprising a mirror. The optical transducer and the optical scanning microelectromechanical system are produced in a common wafer comprising at least a first layer made of silicon or silicon nitride with a thickness of less than one micron and in which at least the mirror and its holding springs are produced.

The first layer of silicon or silicon nitride advantageously has a thickness greater than or equal to 300 nm.

The first layer made of silicon or silicon nitride is in one piece and comprises the mirror and its holding springs.

The wafer comprises the first layer made of silicon or silicon nitride and a second layer made of silicon oxide. An optical guide is contained within these two layers.

The optical guide comprises an optical structure formed in the first layer made of silicon or silicon nitride and the second layer made of silicon oxide, which contributes to the confinement of the optical mode.

Advantageously, the optical guide is formed so as to guide light in the plane of the first layer made of silicon.

Producing the optical guide within one and the same layer as the mirror and its springs makes it possible to obtain a small component and to avoid a step of depositing or growing an additional layer.

It also makes it possible to achieve precise alignment of the mirror with the optical guide and to achieve emission or reception both in a direction perpendicular to the plane of the first layer and in a direction of the plane of the first layer. Indeed, the optical guide makes it possible to guide light in the plane of the layer. The mirror makes it possible to direct light in all directions out of the plane of the layer and into the plane of the layer.

There are notably two possible embodiments of the component. In a first embodiment, the mobile parts of the optical scanning microelectromechanical system are produced in layers of silicon or silicon oxide. In a second embodiment, the mobile parts of the optical scanning microelectromechanical system are produced in the layer of III-V semiconductor material.

The optical transducer may be either a light emitter or a light receiver. In the first case, the emitter is a laser. In the second case, the receiver is a photodiode. In the following text, the term transducer covers its two functions.

Figure 1:
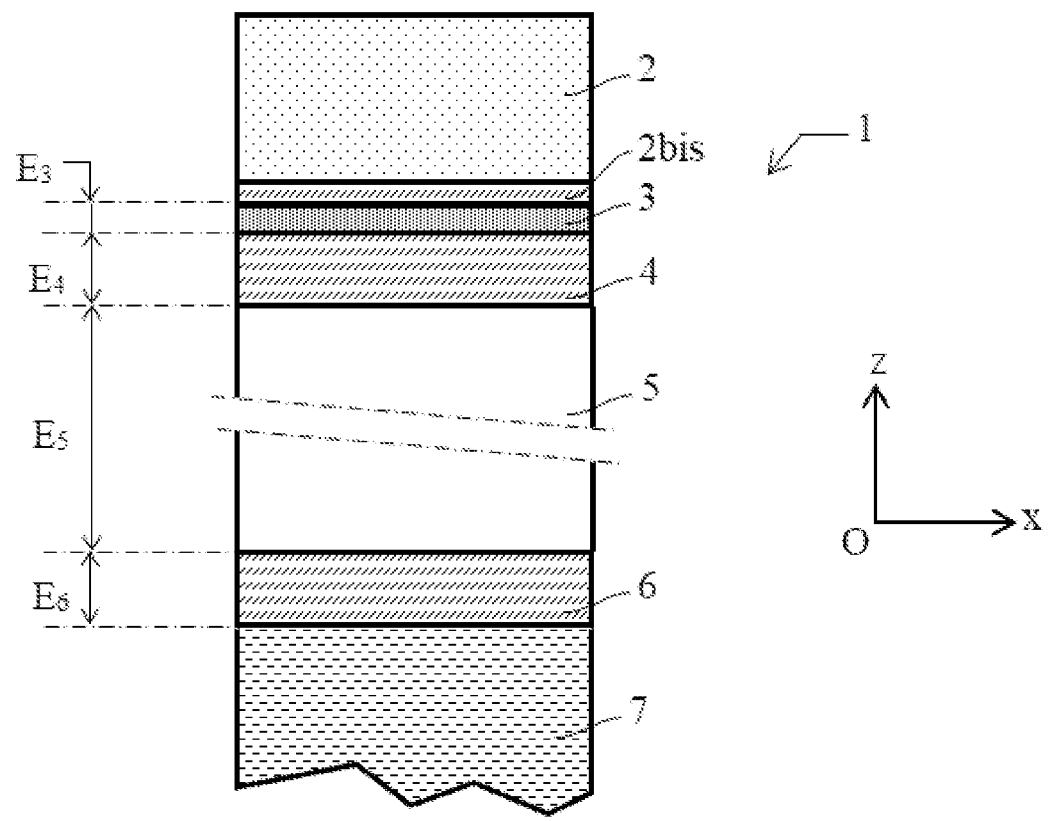
FIG. 1 shows an illustration of the stack of the layers of materials needed to produce a first electronic component according to the invention.

As a first exemplary embodiment, FIG. 1 shows the stack of layers needed to produce a component according to the invention in a first embodiment. This figure and those that follow are referenced in a three-dimensional reference system (O, x, y, z). The cutting plane of FIG. 1 is in a plane (O, x, z). Proceeding from outside the component 1 to the substrate serving as support therefor, the following are found in succession:
- a layer 2 of III-V material,
- a thin transfer layer 2bis of silicon oxide of around one hundred nanometers, which makes it possible to transfer the previous layer 2 onto the following layer 3,
- a first layer 3 made of silicon or silicon nitride, whose thickness $E_3$ is of the order of 500 nanometers,
- a second layer 4 made of silicon oxide, whose thickness $E_4$ is between 3 microns and 4 microns,
- a third layer 5 made of silicon, whose thickness $E_5$ is between 10 microns and 100 microns,
- a fourth layer 6 made of silicon oxide, whose thickness $E_6$ is between 3 microns and 4 microns,
- the actual substrate 7, made of silicon.

The transducer is made of III-V material such as indium phosphide or InP into which quantum wells are integrated. This material is then transferred onto the substrate made of silicon. The one or more optical guides is or are manufactured in the first layer 3 made of silicon or silicon nitride.

The mirror 30 and its holding springs 31 are produced in the first layer 3 made of silicon or silicon nitride.

The second layer 4 made of silicon oxide, located just under this first layer of silicon or silicon nitride 3, contributes to the confinement of the optical mode. In other words, the second layer 4 is contiguous with the first layer 3. The second layer 4 forms a wall of the optical guide.

The much thicker third layer of silicon is used to produce the actuators of the MEMS device for deflecting the emitted or received light beam, depending on whether the transducer is an emitter or a receiver.

In particular, mobile parts 23, 24, 25 of the MEMS device are produced in the third layer 5 of silicon. The mobile parts 23, 24, 25 are able to actuate, that is to say mechanically drive, the mirror 30 and its springs 31.

The third layer 5, comprising the mobile parts 23, 24, 25, is in one piece.

To produce the component, it is necessary to use special semiconductor wafers, as they are known. These are silicon wafers having two buried layers of silicon oxide. The one or more optical guides is or are thus produced in the upper layer of silicon or silicon nitride, and the mechanical structures are produced in the intermediate layer made of silicon.

One solution for obtaining such wafers is to use a conventional wafer called silicon on insulator, or "SOI" in acronym form, to produce the structures of the MEMS. These wafers are commercially available. This wafer comprises the substrate made of silicon, the layer of silicon oxide with a thickness of a few microns and the upper layer of silicon with a thickness of a few tens of microns, which will be used to produce the MEMS mechanical structure. On this wafer, a new layer of silicon oxide with a thickness of 3 to 4 microns is grown, obtained by oxidizing superficial silicon in a suitable furnace. The guide layer made of silicon or silicon nitride is deposited on this last layer of silicon oxide.

The III-V components are produced in a conventional manner, starting by structuring the optical guides and the functions produced in the upper silicon or silicon nitride, and then transferring the III-V materials and arranging them. These manufacturing steps are performed until complete with the necessary metallizations, taking into account the definition of the optical output facets of the components.

The parts of the wafer comprising the III-V components on silicon or silicon nitride and in particular the output facets of the components are then protected by resin or possibly photoresist.

Finally, the mechanical devices of the MEMS and the mirror are produced. This production comprises the following steps:
- Cutting the mirror from the upper layer of silicon through photolithography and silicon etching;
- Producing the MEMS actuators through masking and deep reactive ion etching, known as "DRIE";
- Producing the necessary trenches under the mirror through masking and isotropic etching;
- Metallizing the MEMS structures and the mirror;
- Releasing the mobile parts and the mirror through hydrofluoric acid or HF etching of the two layers of silicon oxide.

Once the MEMS structures and the mirrors have been produced, the protective resin for the III-V components, deposited before the MEMS manufacturing steps, is removed.

Figure 2:
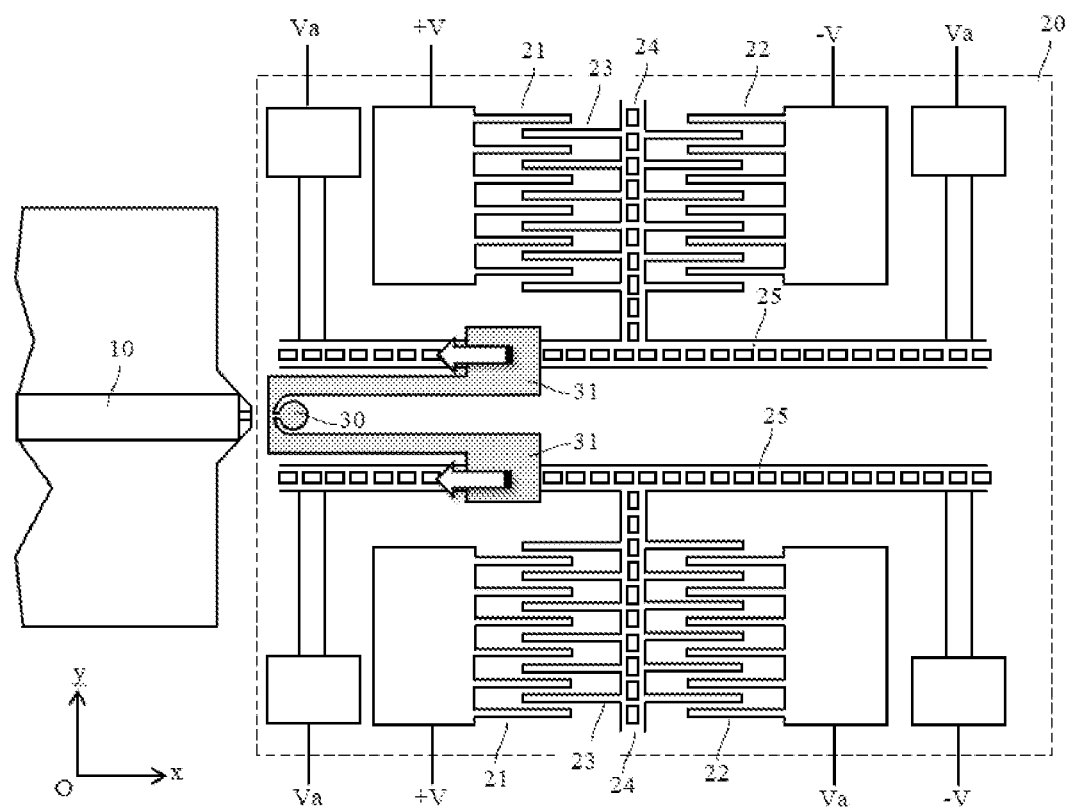
FIG. 2 shows a plan view of an electronic component according to the invention.

There are various configurations for producing the mirror scanning microelectromechanical system according to the invention. By way of non-limiting example, FIG. 2 shows a plan view of the component according to the invention comprising its transducer 10 and its microelectromechanical system 20. This view is in a cutting plane (O, x, y).

The microelectromechanical system 20 comprises two identical actuators and a one-piece assembly produced in the first layer comprising the mirror 30 and its two holding springs 31. This assembly is shown in gray in FIG. 2.

Each actuator consists of two fixed combs 21 and 22 that are identical and symmetrical to one another and a mobile double comb 23 comprising a central beam 24. The teeth of the mobile comb are interwoven with those of the two fixed combs.

The central beam 24 is connected to a second beam 25, perpendicular to said beam 24. The two beams 25 of the two actuators are parallel to one another. Each of these two beams 25 is connected to one of the two holding springs 31.

The fixed combs and the mobile comb of the actuators are voltage-controlled. The control voltages for the fixed parts are a few tens of volts. By way of example, the control voltages +V and −V in FIG. 2 are +50 V on the first fixed comb and −50 V on the second fixed comb. The control voltages Va for the mobile comb are a few volts.

The voltage control of an actuator leads to the translational displacement of the mobile comb and, therefore, that of the beam 25, which moves in the direction of its length. The displacements are shown by white arrows in FIG. 2 and those that follow.

Each holding spring 31 comprises a leaf in the shape of an elongated rectangle connected to the mirror 30 by a connection of very small width. Given their very small thickness, the leaves have a certain elasticity and may thus buckle easily. In FIG. 2, the mirror 30 is of circular shape.

Figure 3:
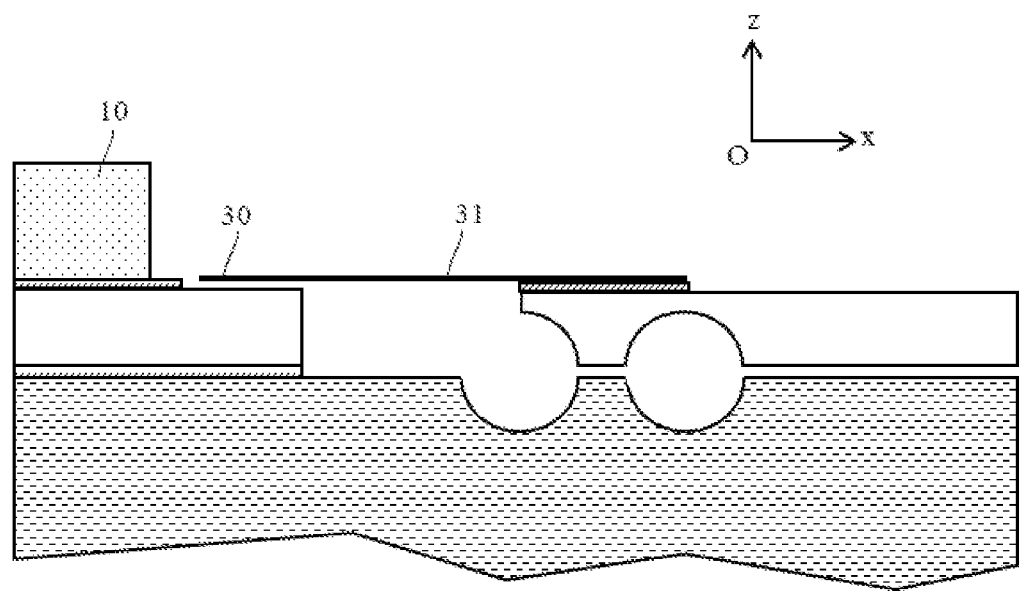
FIG. 3 shows a side view of a first electronic component according to the invention in the absence of stresses from the interdigitated combs.
Figure 4:
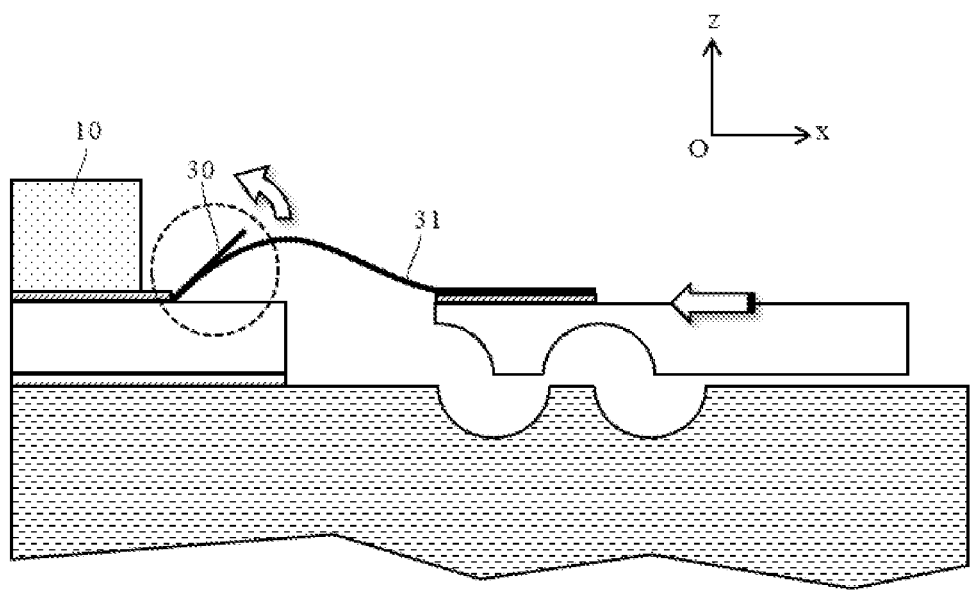
FIG. 4 shows a side view of the first electronic component according to the invention in the presence of stresses from the interdigitated combs.
Figure 5:
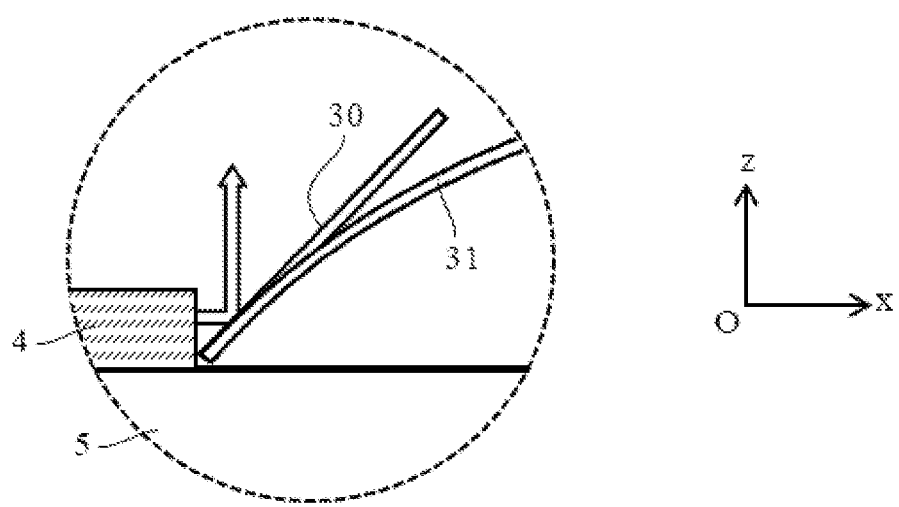
FIG. 5 shows an enlarged partial view of FIG. 4.

The operation of the device is shown in FIGS. 3, 4 and 5, FIG. 5 showing an enlarged partial view of FIG. 4. In FIG. 5, the square-shaped white arrow shows the deflection of the light beam by the mirror when the transducer is a laser.

FIG. 3 shows a side view of the mirror 30 and of its holding springs 31 in the absence of stresses from the interdigitated combs. This side view is shown in a cutting plane (O, x, z). The mirror and its springs are in a horizontal plane, parallel to the axis x. No deflection takes place.

FIG. 4 shows a side view of the mirror and of its holding springs in the presence of stresses from the interdigitated combs. Applying the control voltages leads to the displacement of the two springs, as may be seen in this FIG. 4, which come into abutment under the first layer of silicon or silicon nitride arranged under the III-V transducer referenced 10.

This abutment guidance is provided by a potential difference applied between the second layer and the thick third layer of silicon. The area of the mirror is thus positioned under the layer of silicon used for optical guidance. If the displacement is continued, the leaves of the springs buckle, causing the mirror to rotate.

If the displacements of the two springs are identical, the mirror rotates about the axis y and straightens, as may be seen in FIGS. 4 and 5. If the displacements of the two mirrors are different, the mirror rotates about the axis z. It is thus possible, simply by adjusting the control voltages, to obtain an orientation of the mirror along two different axes, making it possible to deflect a light beam emitted or received along these two axes. Knowing the relationship that links the control voltages to the orientations of the mirror, it is thus possible to obtain the desired deflection.

Figure 6:
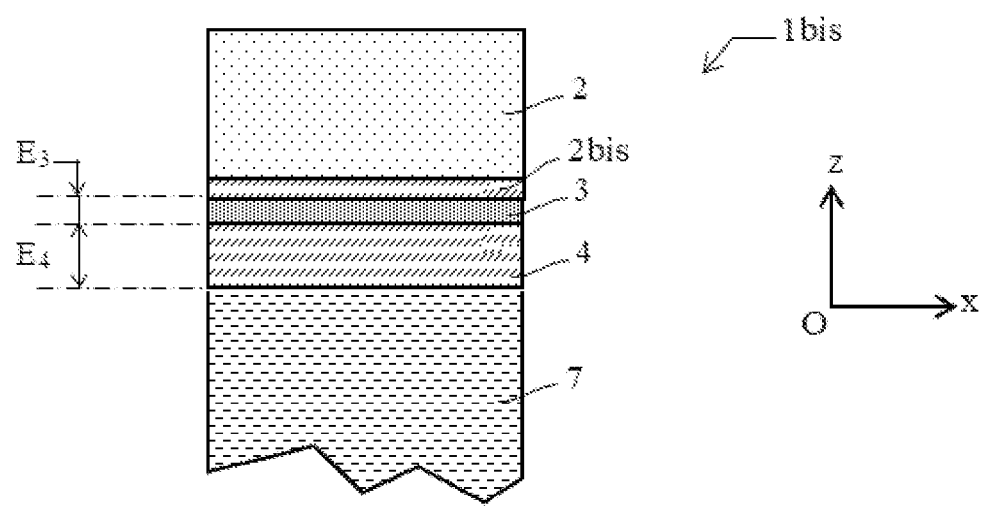
FIG. 6 shows an illustration of the stack of the layers of materials needed to produce a second electronic component according to the invention.

As a second exemplary embodiment, FIG. 6 shows the stack of layers needed to produce a component according to the invention in a second embodiment. The cutting plane of FIG. 6 is in a plane (O, x, z). Proceeding from outside the component 1b is to the substrate serving as support therefor, the following are found in succession:
 a layer 2 of III-V material,
 a thin transfer layer 2bis of silicon oxide of around one hundred nanometers, which makes it possible to transfer the previous layer 2 onto the following layer 3,
 a first layer 3 made of silicon or silicon nitride, whose thickness is of the order of 500 nanometers,
 a second layer 4 made of silicon oxide, whose thickness is between 3 microns and 4 microns,
 the actual substrate 7, made of silicon.

As in the previous first embodiment, the transducer is made of III-V material such as indium phosphide or InP into which quantum wells are integrated. This material is then transferred onto the substrate made of silicon. The optical guides are manufactured in the first layer 3 made of silicon or silicon nitride.

The second layer 4 made of silicon oxide, located just under this first layer 3 of silicon or silicon nitride, contributes to the confinement of the optical mode. In other words, the second layer 4 delimits the optical guide.

The essential difference from the first embodiment is that the mechanical device 21, 22, 23, 24, 25 for deflecting the light beam is produced in the III-V layer. A mechanical device for deflecting the light beam is understood to mean the actuators 21, 22, 23, 24, 25 of the MEMS device, that is to say the actuators of the mirror 30 and of its springs 31. The layer of III-V material is in one piece.

This may comprise the same components as the previous deflection device shown in FIG. 2. The components are arranged in the same way, but the actuators 21, 22, 23, 24, 25 are produced in the layer of III-V material. They comprise, as in the previous case, a symmetrical structure with interdigitated combs connected by beams to an assembly comprising two leaf springs 31 supporting a mirror 30 positioned in front of the transducer.

Figure 7:
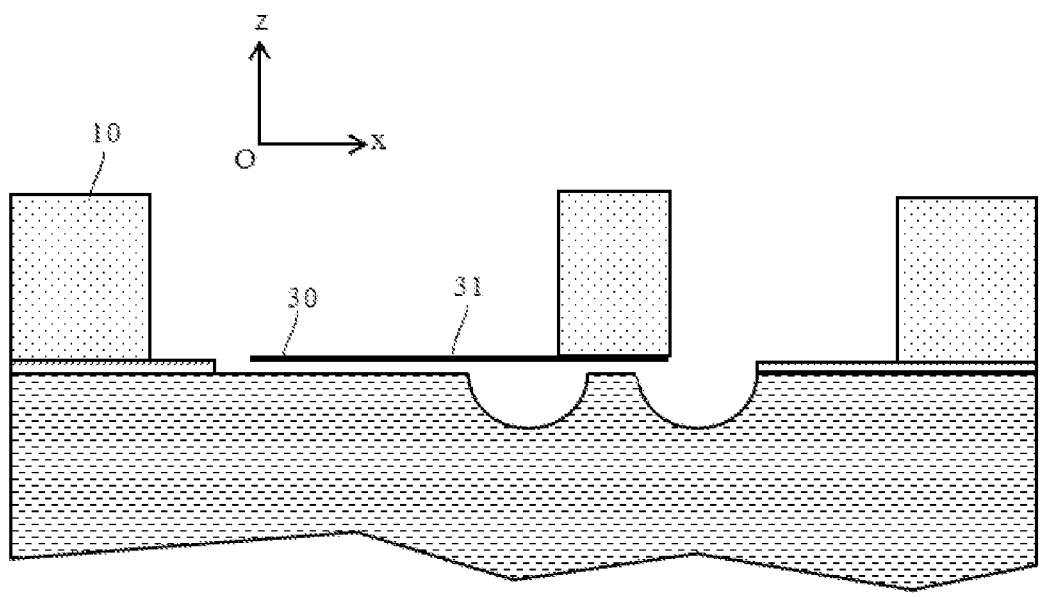
FIG. 7 shows a side view of a second electronic component according to the invention in the absence of stresses from the interdigitated combs.
Figure 8:
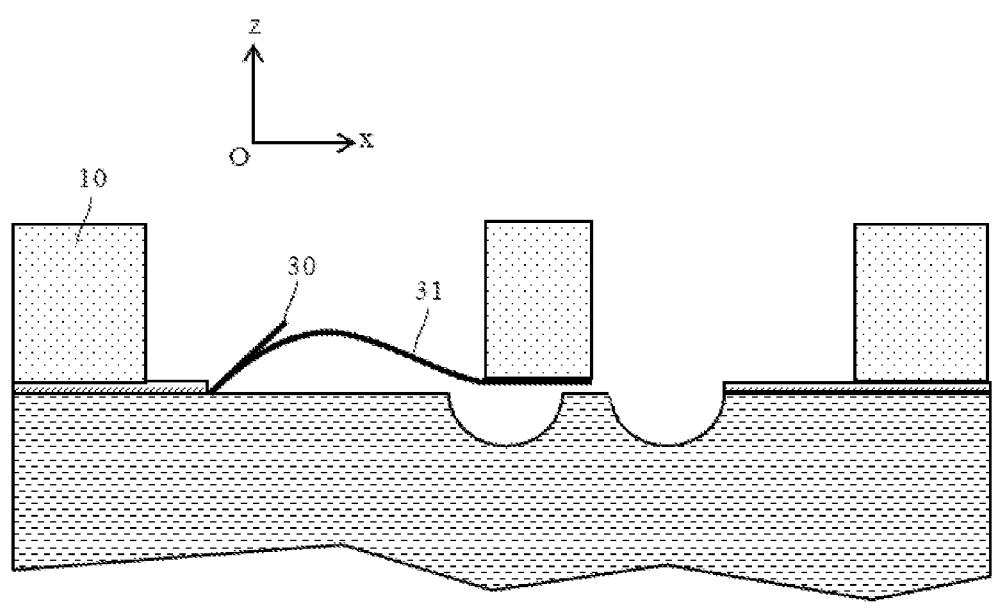
FIG. 8 shows a side view of the second electronic component according to the invention in the presence of stresses from the interdigitated combs.

The operation of the device is indicated in FIGS. 7 and 8, which show a side view of the mirror and its holding springs in the absence and in the presence of stresses from the interdigitated combs. This side view is shown in a cutting plane (O, x, z). As in the previous embodiment, the mirror and its springs are produced in the thin layer of silicon or silicon nitride. The mechanism for orienting the mirror is the same. By applying identical or different control voltages to the actuators, the mirror is oriented along two different axes.

The abutment guidance for the mirror is provided by a potential difference applied between the second layer and the substrate.

One of the benefits of this second embodiment over the previous one is that, since the number of layers required is lower than the first embodiment, the components may be implanted on standard wafers of simpler design, already used to produce III-V components heterogeneously integrated on a standard wafer. If necessary, the substrate made of silicon may be etched and used to produce parts requiring suitable mechanical properties.

Producing this type of component comprises the following steps:
 Producing the mechanical structures made of III-V materials with three steps of masking, DRIE etching and isotropic etching for the trenches;
 Producing the mirror and its holding springs by clearing the upper layers up to the layer of silicon or silicon nitride and then by masking, RIE etching and isotropic etching to define the mirror and its retaining springs and prepare their release;
 Metallizing the MEMS structures in order to make electrical contact and define the mobile mirrors;
 HF acid etching in order to release the mobile parts of the various devices;
 Once the structures of the MEMS and the mirrors have been produced, removing the protective resin for the III-V components, deposited before the MEMS manufacturing steps.

In this embodiment, the III-V layer is deposited on the wafer before the stage of producing the mechanical structures.

The component according to the invention may comprise a plurality of transducers and/or multiple MEMS and/or a plurality of optical guides.

The invention claimed is:

1. An optoelectronic component comprising an optical transducer made of III-V semiconductor material and an optical scanning microelectromechanical system comprising a mirror and holding springs, the optical transducer and the optical scanning microelectromechanical system being produced in a wafer comprising, in this order, a layer of III-V semiconductor material, a first layer made of silicon or silicon nitride with a thickness of less than one micron and wherein at least the mirror and its holding springs are produced, a second layer made of silicon oxide, the optoelectronic component comprising an optical guide contained within the first layer made of silicon or silicon nitride and the second layer made of silicon oxide.

2. The optoelectronic component as claimed in claim 1, wherein the common wafer comprises, in this order, the layer of III-V semiconductor material, the first layer made of silicon or silicon nitride, the second layer made of silicon oxide, the third layer made of silicon, the fourth layer made of silicon oxide, and a substrate, the optical scanning microelectromechanical system comprising mobile parts produced in the third layer made of silicon and the fourth layer made of silicon oxide.

3. The optoelectronic component as claimed in claim 2, wherein a transfer layer made of silicon oxide is arranged between the layer of III-V semiconductor material and the first layer made of silicon or silicon nitride.

4. The optoelectronic component as claimed in claim 2, wherein the thickness of the second layer made of silicon oxide is between 3 microns and 4 microns, the thickness of the third layer made of silicon is between 10 microns and 100 microns and the thickness of the fourth layer made of silicon oxide is between 3 microns and 4 microns.

5. The optoelectronic component as claimed in claim 1, wherein the common wafer comprises, in this order, the layer of III-V semiconductor material, the first layer made of silicon or silicon nitride, the second layer made of silicon oxide, and a substrate, the optical scanning microelectromechanical system comprising mobile parts produced in the layer of III-V semiconductor material.

6. The optoelectronic component as claimed in claim 5, wherein a transfer layer made of silicon oxide is arranged between the layer of III-V semiconductor material and the first layer made of silicon or silicon nitride.

7. The optoelectronic component as claimed in claim 5, wherein the thickness of the second layer made of silicon oxide is between 3 microns and 4 microns.

8. The optoelectronic component as claimed in claim 2, wherein:
   the holding springs are two identical flat leaves having substantially the shape of elongated rectangles located on either side of the mirror, the mirror being connected to said leaves by a single attachment;
   the mobile parts consist of two identical beams, parallel to one another, each beam being connected to a set of voltage-controlled interdigitated combs so as to ensure the displacement of each beam in one and the same given direction;
   each leaf is integral with one of the two beams and moves therewith, the displacement of the beams causing the leaves to buckle in abutment on the optical guide, joint buckling of the two leaves tilting the mirror in a first direction, differential buckling of the two leaves tilting the mirror in a second direction.

9. The optoelectronic component as claimed in claim 1, wherein the optical transducer is a laser.

10. The optoelectronic component as claimed in claim 1, wherein the optical transducer is a photodiode.

11. The optoelectronic component as claimed in claim 1, wherein the wafer consists of layers each comprising silicon and the layer of III-V semiconductor material.

* * * * *